United States Patent [19]
Vlasenko et al.

[11] Patent Number: 6,144,591
[45] Date of Patent: Nov. 7, 2000

[54] REDUNDANCY SELECTION CIRCUIT FOR SEMICONDUCTOR MEMORIES

[75] Inventors: Peter Vlasenko, Kanata; John Wu, Ottawa; Arun Achyuthan, Stittsville; Guillaume Valcourt, Hull, all of Canada

[73] Assignee: Mosaid Technologies Incorporated, Kanata, Canada

[21] Appl. No.: 09/193,239

[22] Filed: Nov. 17, 1998

Related U.S. Application Data

[63] Continuation-in-part of application No. 09/000,954, Dec. 30, 1997, Pat. No. 5,877,992.

[51] Int. Cl.$^7$ ................................................. G11C 7/00
[52] U.S. Cl. ................................. 365/200; 365/201
[58] Field of Search ................................. 365/200, 201

[56] References Cited

U.S. PATENT DOCUMENTS

| | | | |
|---|---|---|---|
| 4,281,398 | 7/1981 | McKenny et al. | 365/200 |
| 4,389,715 | 6/1983 | Eaton, Jr. et al. | 365/200 |
| 4,471,472 | 9/1984 | Young | 365/200 |
| 4,691,300 | 9/1987 | Pelley, III et al. | 365/200 |
| 5,359,561 | 10/1994 | Sakomura et al. | 365/201 |
| 5,600,277 | 2/1997 | Koelling | 327/526 |
| 5,646,896 | 7/1997 | Pinkham | 365/200 |
| 5,673,227 | 9/1997 | Engles et al. | 365/200 |
| 5,761,138 | 6/1998 | Lee et al. | 365/200 |

*Primary Examiner*—Vu A. Le
*Attorney, Agent, or Firm*—Kevin Pillay

[57] ABSTRACT

This invention provides a data bit redundancy method and apparatus that permits the replacement of faulty bitlines on a data bit basis as opposed to a column address basis. This invention provides a semiconductor memory device having memory cells arranged in columns and rows. Normal local data lines are connected to a global data line via a first switch. A redundant memory data line is connected to the global data line via a second switch. A control generating first and second control signals are coupled to the respective first and second switches for operating the switch in response to a status of a fuse component, whereby when the fuse is intact the normal data lines are connected to the global data line and when the rise is blown the redundant data lines are connected to the global data line, thus not requiring additional redundancy address decoding circuitry.

4 Claims, 4 Drawing Sheets

REDUNDANCY SELECTION CIRCUIT FOR SEMICONDUCTOR MEMORIES

This application is a Continuation In Part of U.S. application Ser. No. 09/000,954, filed Dec. 30, 1977 U.S. Pat. No. 5,877,992.

This invention relates to semiconductor memories and in particular to semiconductor memories having a flexible and efficient structure for substituting redundant memory for defective memory, particularly in wide word memory.

BACKGROUND OF THE INVENTION

Semiconductor random access memories (RAM) are typically formed of row lines and columns crossing the row lines. Memory cells, that store charge, are located adjacent each crossing of the rows and columns. Thus, accessing any bit in the RAM given its row and column address is analogous to locating the bit in an array given its (x, y) coordinates. Each bit of information stored in a memory is a tiny capacitor that stores the value of the bit as a 'high' (VCC) or 'low' (GND) voltage. The rows and columns are selected by respective row (or x) decoders and column (or y) decoders which receive memory addresses so as to read and write to particular bit cells.

Typically data is accessed in bits or words, thus groups of memory cells in a given word are generally connected to a common wordline which may then be activated by a decoded, address signal applied thereto. The individual bits across each word are connected to common bitlines. For example, in a dynamic random access memory DRAM a single column or complimentary bitline pair is typically coupled to a differential sense amplifier, a column select, precharge circuitry and a collection of storage cells. The storage or bit cells may have a single port for reading and writing.

In a typical DRAM there are actually several bitlines each tied to respective sense amplifiers. In a read operation, every bit in a selected row or wordline is sensed by its respective sense amplifier. The selected column is then read out onto a local data bus. A write operation is similar, the value to be written is first fed into each sense amplifier over the local data bus. The sense amplifier then writes this value into the selected column's storage cell. Furthermore, once capacitors are used as storage cells in a DRAM, the charge stored in each cell tends to leak away over time. Therefore, it is necessary to refresh the value in each cell periodically. In typical DRAMs each row must be refreshed every 16, 30, 64 or 128 msec. Refreshing a row is similar to reading it except the data does not emerge from the columns. In a refresh operation each bit in a selected row is moved to its respective sense amplifier. Each sense amplifier then amplifies the value on its bitlines and drives the refresh value back into the storage cell.

There are sometimes physical faults caused by manufacturing defects associated with the cells in a particular column or row. For this reason, RAMs usually contain redundant (spare) columns and rows. These redundant memory cells are used in the memory array in order to effect replacement of defective memory cells, word lines and bitlines. In a typical DRAM process both word lines and bitlines must be replaced in order to achieve economic yields. For embedded DRAM macro cells in order to increase the data bandwidth of DRAMs and application specific integrated circuit (ASICS) it is necessary to dramatically increase the word width.

Recent integration trends have resulted in embedding DRAM in ASIC processes. One main advantage of embedded DRAM implementation is a substantial bandwidth increase, since the data to and from the memory does not have to be transferred externally.

A problem with wide word widths however, is the difficulty in handling bitline redundancy. Implementing bitline redundancy by replacing a column address results in a large substrate area overhead due to a large number of cells reserved for redundancy. Typically, the ratio of redundant bitlines to normal bitlines is about 3%. However, as the occurrence of defective memory is unavoidable, chip manufacturers have devised various schemes to allow replacement of this faulty memory at manufacture time.

In one implementation, for example, in an embedded wide word DRAM macro cell replacement of memory blocks with redundant memory blocks is handled by additional logic circuits on the data 1/0-lines, this method is inefficient in that it occupies a large area and consumes a large amount of power.

Other schemes provide redundant y decoders for the addressing of the redundant columns in order to allow the disabling and replacement of the faulty columns. Circuitry for addressing the redundant columns is relatively simple compared to the problem associated with re-routing the redundant data path to the data 1/0 of the memory.

In U.S. Pat. No. 4,691,300 an apparatus and method for redundant column substitution in a memory device with column redundancy is described. Rather than inhibiting normal column decoding and selecting a redundant column in a response to a defective column address, this patent describes a method that proceeds in parallel with normal column access and redundant column access. An 1/0 multiplexer is provided which receives both the normal and redundant data and in response to an input from the redundant column decoder selects the redundant data. Furthermore, the redundant columns have to be located physically close to the 1/0 multiplexer. This invention requires the provision of additional redundant column select and redundant column decoder circuitry.

In U.S. Pat. No. 5,673,227, utilizes a redundant multiplexer which is programmed by a fuse circuit for determining which of the top or bottom redundant data lines replaces a defective column data line. This invention requires additional circuitry for fuse decoders and the redundant multiplexers.

In U.S. Pat. No. 4,281,398, block redundancy is utilized to replace defective memory blocks. Block redundancy selection is implemented through a multiplexer and repair buffer which are coupled to the data node input/output circuitry. The redundant block substitution is carried out by selectively applying a high voltage on the output data terminal of the block in which the bad bit is located. A separate programming current supply is provided for blowing a polysilicon fuse in the repair buffer which electrically disconnects the bad block of memory while simultaneously substituting a redundant block in its place.

In U.S. Pat. No. 5,359,561, a memory device is described which includes a plurality of data lines at least one redundant data line and one common data line. Column switches for reading and writing are installed between the data lines of the non-normal columns and a common data line and between the data lines of the redundant column and the common data line. A column decoder is provided for controlling the plurality of column switches to select the appropriate normal or redundant columns for read and write operations.

In U.S. Pat. No. 5,600,277, DRAM redundancy fuse circuit is described and used CMOS pass gates to choose one of a pair consisting of a binary logic signal and its compliment logic signal. The circuit utilizes NMOS transistors as pass gate devices the gate terminals of which are driven by boosted Vpp supply.

The disadvantage of the circuit is the control circuit for the pass gate switches occupy a greater area on the chip in comparison to other CMOS passgate circuits. Furthermore, the greater number of components used in this design increases the current continuation and the probability of the circuit failure, particularly if the circuit is duplicated a number of times in a given semiconductor memory such as for a redundancy selection circuit in wide data bus memories.

In U.S. Pat. No. 4,389,715 this patent describes a redundancy circuit in which defective row addresses and defective column addresses are stored. A comparator sequentially compares the defective memory cell addresses against incoming address data. When the comparator senses a match, a control signal is generated to initiate substitution of spare memory cells for the defective memory cells.

Accordingly, there is a need for an improved redundancy fuse pass gate circuit which makes minimal use of semiconductor area, has a decreased current consumption and setting time, and minimizes the number of devices constituting the circuit, thereby improving reliability of the circuit.

SUMMARY OF THE INVENTION

This invention seeks to provide a data bit redundancy method and apparatus in a semiconductor memory that minimizes the timing difference between a normal data path and a redundant data path and which minimizes the number of fuses required in repairing faulty bitlines. Furthermore, this bitline redundancy method permits the replacement of faulty bitlines on a data bit basis as opposed to a column address basis.

In accordance with this invention there is provided a semiconductor memory device having memory elements arranged in rows and columns and memory elements being accessed by energizing one or more rows and columns, the memory comprising:

(a) normal memory bitlines connecting a plurality of normal data bits;

(b) redundant memory bitlines connecting a plurality of redundant data bits;

(c) a common global data line;

(d) a switch interposed between said normal global data line and said common global data line operable to connect said normal global data line to said common global data line in response to a control signal;

(e) a second switch interposed between said redundant global data line and said common global data line, operable to connect said redundant global data line to said common global data line in response to a complement of said control signal and circuit; and (f) a control circuit for generating said control signal and said complement control signal in response to a status of a fuse component.

A further aspect of the invention provides for a circuit which may be used for implementing address redundancy using fewer circuit elements than in the prior art, thereby achieving a lower current consumption.

BRIEF DESCRIPTION OF THE DRAWINGS

A better understanding of the invention will be obtained by reference to the detailed description below in conjunction with the following drawings in which.

DETAILED DESCRIPTION OF A PREFERRED EMBODIMENT

Figure 1:
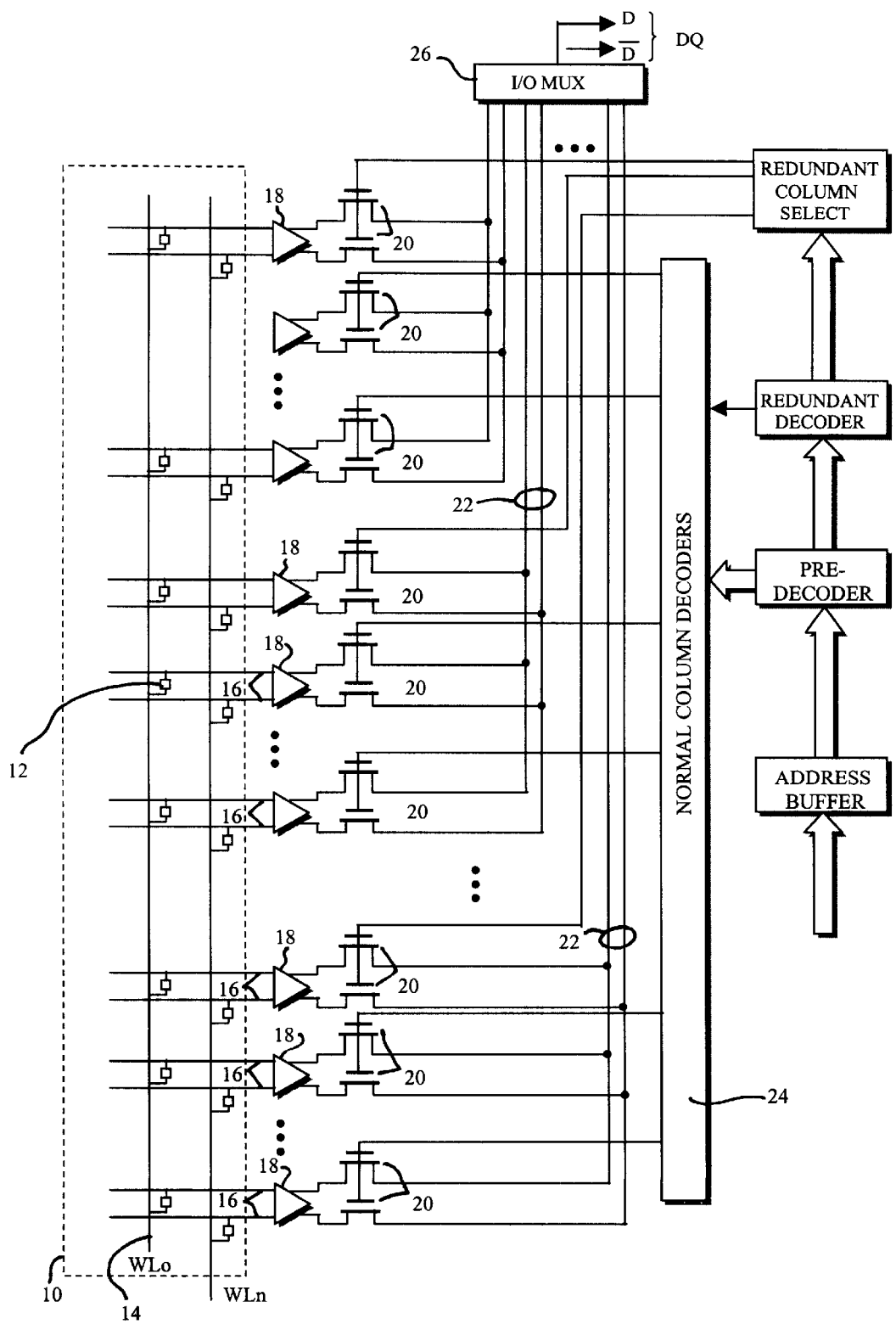
FIG. 1 illustrates a redundancy circuit according to the prior art.

Referring to prior art FIG. 1, a memory array is shown generally by numeral 10 The memory array 10 includes groups of memory cells 12 arranged in columns and rows with memory cells in a given word connected to a common wordline 14. The individual memory cells comprising the data bits are connected to complimentary bitlines 16. A pair of bitlines are connected to respective sense amplifiers 18, the outputs of the sense amplifiers are coupled to a plurality of field effect transistor (FET) switch pairs 20 which are in term coupled to an 1/0 line pair 22. Groups of bitlines are connected to common 1/0 line pairs. The selected bitline is activated by a signal received from an address decoder 24 which then activates the appropriate FET switch pair 20 to pass the bitline data via an 1/0 multiplexer 26 to a common global data line pair DQ. Redundancy is implemented by providing a redundant column in each group and activating the appropriate redundant column by a decoded redundant select signal. With this general configuration of a prior art memory, the data redundancy circuit of the present invention is implemented as will be described below.

Figure 2:
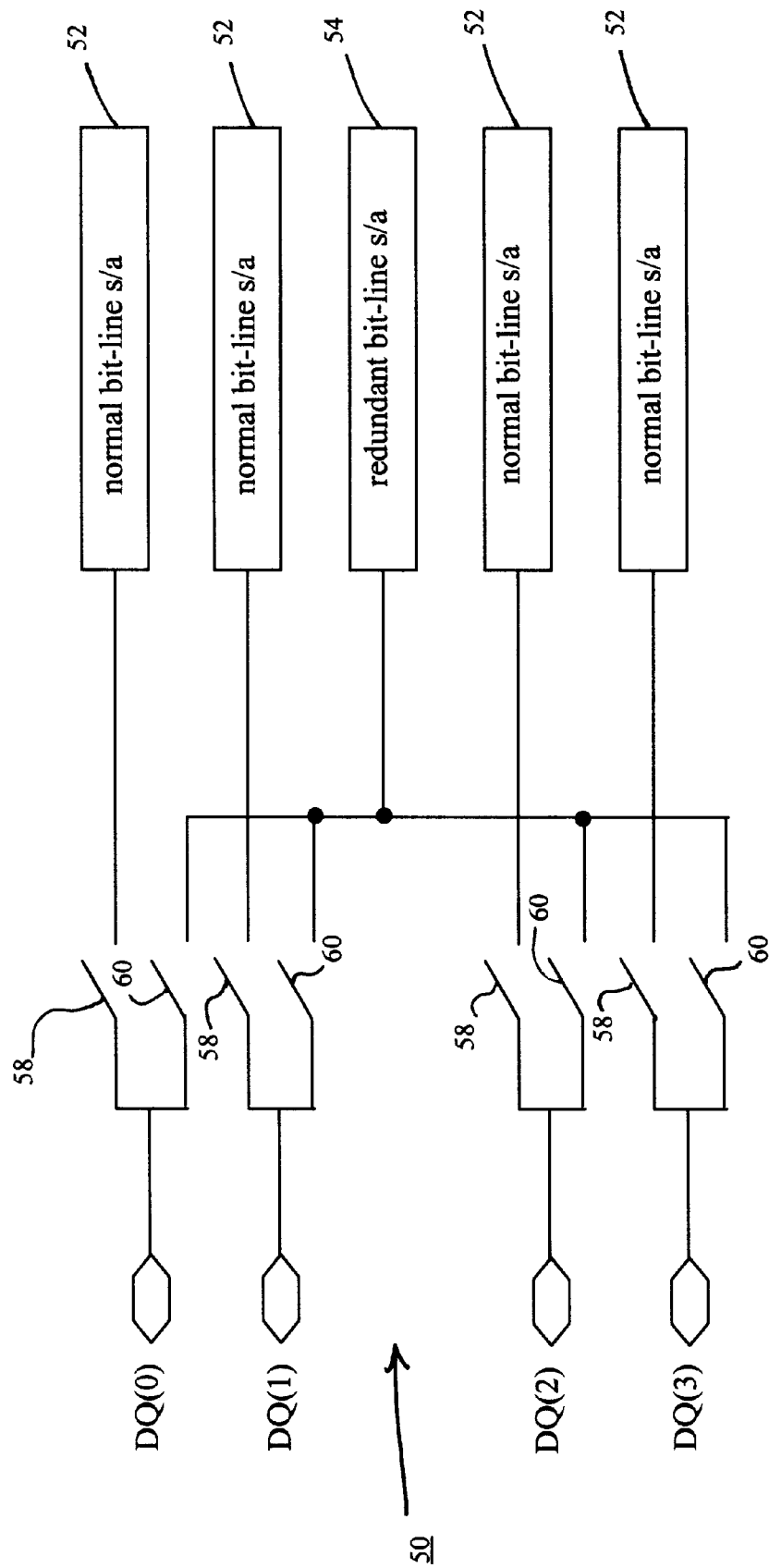
FIG. 2 is a schematic diagram of a data redundancy scheme according to an embodiment of the present invention.

The proposed scheme replaces bitlines based on a data bit basis. Thus, referring to FIG. 2, a schematic of a data redundancy circuit according to an embodiment of the present invention is indicated generally by numeral 50. For simplicity the groups of normal bitlines, along with their sense amplifiers, are shown as block 52. Similarly, a redundant bitline and its associated sense amplifiers and circuitry is indicated by block 54. The normal bitline/sense amplifier blocks 52 are each coupled to respective global data line DQ. Here, four global data lines DQ(O) . . . DQ(3) are shown. Each of the 5 global data lines is connected by switches to its respective normal bitline block 52. The redundant bitline block 54 is connected by a switch 60 to each of the global data lines DQ(0) . . . DQ(3).

The redundancy replacement is accomplished by means of the control switches 58 which, in a normal operation are closed i.e. with no replacement, steer the data to and from the data lines DQ to their respective normal bitlines sense amplifiers 52. When one of the bitline blocks 52 is to be replaced, the appropriate switch 58 is opened and the appropriate switch 60 is closed, thus the data is steered to or from the redundant bitline block 54. The redundant block may be addressed as normal or additional addressing circuitry may be used.

Figure 3:
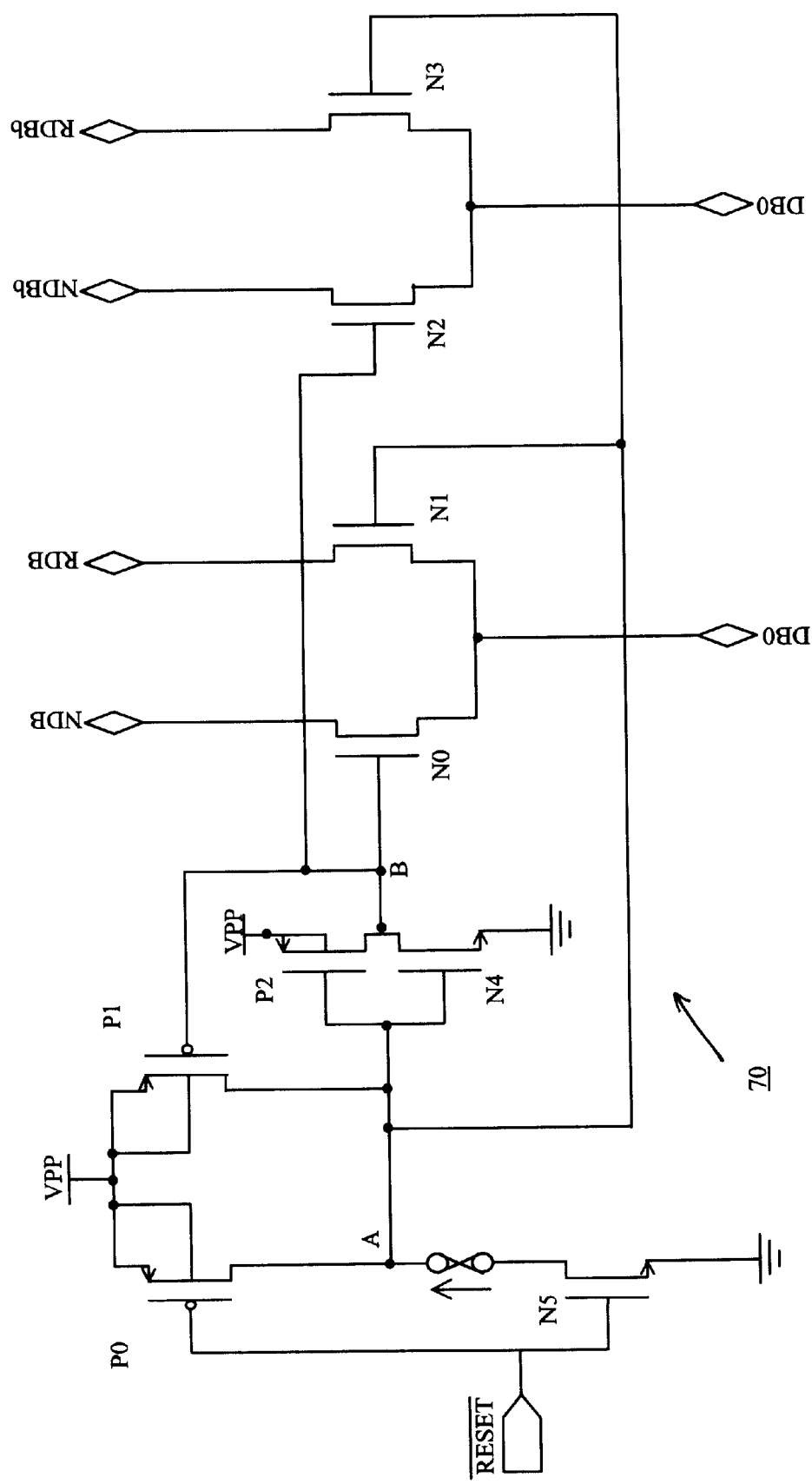
FIG. 3 is a schematic circuit diagram of a switch in accordance with an embodiment of the present invention.

Referring now to FIG. 3, a detailed circuit diagram of a redundancy switching circuit according to an embodiment of the present invention is shown generally by numeral 70. The circuit comprises the switch or load section B and control of section A. A normal local data line signal NDB is applied to a source terminal of a first NMOS transistor N0, while a redundant local data line signal is transistor N1. The drain terminals of transistors N0 and N1 are coupled to a common global data line DB. A RESET signal node receives a RESET signal and is coupled to a gate terminal of an NMOS transistor N5 and a gate terminal of a PMOS transistor P0. The source terminal of the transistor P0 is connected to a boosted voltage supply Vpp, while the source terminal of the NMOS transistor N5 is connected to ground. The drain terminal of the PMOS transistor P0 is connected to a first terminal of a fuse F1 at a node A and the second terminal of the fuse F1 is connected to the drain terminal of the NMOS transistor N5. A PMOS transistor P1 is connected in parallel with the PMOS transistor P1 such that its source terminal is connected to the boosted supply Vpp and its drain terminal is connected to the node A. A Vpp inverter circuit is implemented by a PMOS transistor P2 and an NMOS transistor N4. The input of the inverter is coupled to the node A. The output of the inverter is coupled to the gate of the NMOS transistor N0 at a node B. The node A is also connected to the gate terminal of the NMOS transistor N1. The transistor P2 has its source terminal connected to the Vpp boosted supply, while the source of the NMOS transistor N4 has its source connected to ground. The drains of the respective transistors P2 and N4 are coupled together to provide the output for the inverter. The gates of transistors P2 and N4 are coupled together and in turn coupled to the node A as the input to the inverter. A second pair of NMOS transistors N2 and N3 are also provided, whereby the complimentary data line signals NDBb is connected to the source terminal of N2 and a complimentary redundant data line signal RDBb is connected to the source terminal of transistor N3. The drain terminal of each of these transistors N2 and N3 are coupled together to a complimentary normal common data line NDBb. The gate of the transistor N2 is coupled to the node B and the gate of the transistor N3 is coupled to the node A.

The operation of the circuit will be explained as follows. If there are no defective columns, the fuse F1 is intact. At circuit initialization, the reset signal is pulsed low thus turning off the NMOS transistor N5 and turning on the transistor P0. The effect of this is to drive the node A 'high' to Vpp. The 'high' at node A will thus turn off the transistor P2 and turn on the NMOS transistor N4 which pulls node B 'low' through the transistor N4. During normal operation the reset signal is returned 'high' and thus node A is pulled 'low' via the intact fuse and transistor N5. This 'low' is applied to the gates of transistors N1 and N3 turning them off while the 'high' at node B is applied to the gates of transistors N0 and N2 turning them on. As a result, data is steered between the normal data lines and the common data lines.

If the defective columns are detected during testing, fuse F1 is blown and node A remains 'high' after the reset pulse returns 'high' due to the feedback transistor P1. Thus re routing of the data signals from the redundant data line pair to the common global data line pair, without additional addressing of the redundant memory.

The positive supply for the fuse latch is derived from the internally generated DRAM Vpp supply in order for the NMOS switches to pass the full Vdd level. Only NMOS switches are re-used to reduce the area and reduce the parasitic capacitance of the pass gates. After the reset pulse has been received there is no further switching of the circuits. This reduces any spurious current. A further benefit of the circuit is that it adds an extra Vpp reservoir capacitance to the bitlines.

Figure 4:
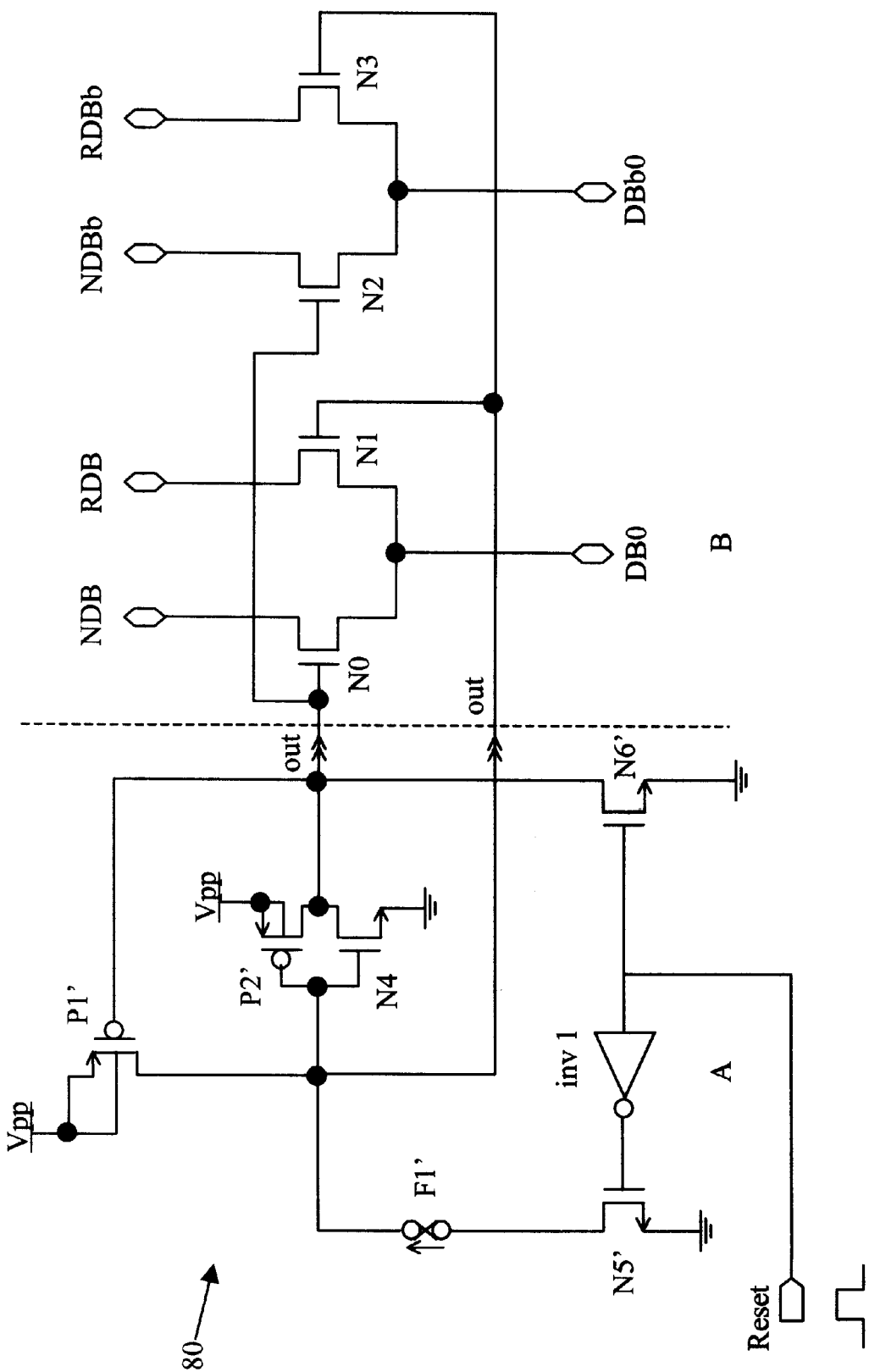
FIG. 4 is a schematic circuit diagram of a switch in accordance with a further embodiment of the present invention.

Referring to FIG. 4, another embodiment of the present invention is shown generally by numeral 80. As in the previous embodiment described with reference to FIG. 3, the circuit of this embodiment includes a control section A and a switch section B. The switch section B is similar to that of FIG. 3 and consists of NMOS pass gates will not be described further. With regard to the control section A, the circuit comprises transistors P1', P2' and N4' which constitute a latch, while transistors N5', N6', an inverter INV1 constitute a latch reset chain. The state of the control circuit is set by a fuse F1'. The reset chain circuit comprises a reset signal node for receiving a RESET signal which is coupled to a gate terminal of the NMOS transistor N6' and the input of the inverter INV1. The output of the inverter INV1 drives the gate terminal of the NMOS transistor N5'. The transistor N5' drives the fuse F1' having a first terminal connected at a node A which is in turn connected to the input of the latch circuit. The source terminal of transistor N5 is connected to ground. Transistors P2' and N4' have their gates connected together forming the input of the latch at node A and their drains connected to provide the output control signal OUT- to the switch section. The PMOS transistor P1' has its source connected to a boosted voltage supply Vpp and its drain connected to node A, the input of the latch. The gate of P1' is connected to the output OUT- of the latch. The transistor P2' has its source connected to Vpp and the source of transistor N4' is connected to ground.

There are two states of operation of the circuit, namely, a first state when the fuse is not blown and a second state when the fuse is blown. Depending on the state of the fuse, the circuit maintains one of the two stable states after the RESET signal at the reset terminal is driven by a positive pulse from a low level Vss to a high level Vdd and back to Vss. In the first state defined by the use being intact, a low level signal on the reset terminal keeps transistor N6' off and transistor N5' on. In this case, the fuse F1' is connected to ground via transistor N5' overriding the PMOS transistor P1'. The inverter formed by transistors P2' and N4' with the boosted supply Vpp, has its input (node A) also driven low and its output (OUT-) high to Vpp and thus, with Vpp applied to its gate, P1' is in its non-conducting state. In this case, both output ports (OUT and OUT-) have receiving the boosted supply Vpp and N1 and N3 receiving Vss signals of the proper polarity driving the switches in section B, with N0 and N2.

When a positive pulse is applied to the reset terminal (generally, after power-up), transistor N6' overrides transistor P2' pulling the OUT- node low and turning on P1'. This in turn pulls node A and OUT to Vpp and transistor N4' turns on. The outputs of the control circuit are therefore flipped over temporarily. However, after the positive pulse at the reset terminal goes low, the transistor N5' overrides transistor P1' again and the circuit returns back to its previous state as described above, due to the fact that the fuse F1' is intact, and therefore, provides the pull-down path between node A and N5.

In the second state defined by the fuse F1' blown, it may be seen that the low level at the reset terminal does not define the state of the circuit until the signal at the reset terminal produces a positive pulse (gain, generally, after power-up). Thus, before the positive pulse is applied to the reset terminal, the circuit state is indeterminate Applying a positive pulse at the reset terminal drives transistor N6' on and transistor N6' overrides P2'. A low level on the OUT- terminal turns transistor P1' on and this transistor P1' drives the OUT terminal high to Vpp. The transistor N5' does not have any influence on the circuit since the fuse F1' is blown. Therefore, once the positive pulse at the reset terminal returns to Vss, the inverter formed by transistors P2' and N4' still has its input as Vpp and its output low, keeping P1' turned on. Thus, P1', P2' and N4' comprise the latch which maintains the circuit in its second stable state, indicating redundancy is in use and steering the data to and from redundant data buses RDB and RDBb.

In variation of the circuit of FIG. 4, the transistors N6' and N5' may have their gates separately driven by the output of a cross-coupled NOR gate latch so that high levels on the gates of transistors N5' and N6' never exist simultaneously. This would have the effect of decreasing the crow-bar current through the circuit on the edges on the RESET signal. Furthermore, transistor N5' should be chosen of a size to allow a sufficient current to override transistor P1' and similarly, the size of N6' should be chose to carry a sufficient current to override transistor P2'. The remaining transistor sizes may be chosen so as to carry the desired current for the circuit.

Thus, it may be seen that with the present embodiment, there is a reduced component count in the redundancy fuse control circuit resulting in greater reliability and performance, while allowing a full Vpp to be applied to the pass gate switches.

Thus, it may be seen by use of the present invention, redundant address programming circuits predecoders and decoders are not required since data is simply steered to the relevant databit to be replaced. Furthermore a separate redundant column addressing scheme is not required since the redundant bit cells are connected in parallel with the normal bitline cells. And are addressed as the normal bit cell. Furthermore there is no fuse in the data path to add an extra time delay.

While the invention has been described in connection with the specific embodiment thereof, and in a specific use, various modifications thereof will occur to those skilled in the art without departing from the spirit of the invention as set forth in the appended claims.

The terms and expressions which have been employed in this specification are used as terms of description and not of limitations, there is no intention in the use of such terms and expressions to exclude any equivalence of the features shown and described or portions thereof, but it is recognized that various modifications are possible within the scope of the claims to the invention.

What is claimed is:

1. A semiconductor memory device having memory cells arranged in rows and columns, the memory cells being accessed by energizing one or more rows and columns; said memory comprising:
    (a) normal local data lines coupled to normal memory bitlines, said normal bitlines coupled to a plurality of normal memory cells;
    (b) redundant local data lines coupled to redundant memory bitlines said redundant bitlines coupled to a plurality of redundant memory cells;
    (c) a common global data line;
    (d) a first switch interposed between said normal local data lines and said common global data line, operable to connect said normal data line to said common global data line in response to a first control signal received at a first control input thereof;
    (e) a second switch interposed between said redundant local data line and said common global data line, operable to connect said redundant data line to said common global data line in response to a second control signal received at a second control input thereof,
    (f) a level shifter circuit with latching having first and second outputs for generating said first and second control signals thereat, said circuit having an input for receiving a RESET signal to drive and latch said first and second outputs, each said output in a respective latch state being pulled down to a low level through an N-channel transistor as the other output is latched high through a P-channel pull-up transistor; the output being set and reset by pull-down transistors;
    (g) a fuse element interposed between on of said pull-down transistors and one of said outputs, a state of said fuse determining the relative output state of said outputs when said RESET signal is applied to said latching circuit.

2. A semiconductor memory device having memory elements arranged in rows and columns and said memory elements being accessed by energizing one or more rows and columns, said memory comprising:
    (a) normal memory columns;
    (b) redundant memory columns;
    (c) memory decoder for receiving memory addresses to generate a plurality of decoded column address signals, corresponding to respective normal memory columns to be energized; and
    (d) switches each receiving at an input thereof one of said decoded column addresses, and having a first output coupled to said normal memory column corresponding to said decoded column address and a second output coupled to a redundant memory column, each of said switches being individually programmable to selectively switch said input signal to one of said first or second outputs such that a respective decided column address corresponding to a defective normal column is steered from said defective normal column to said redundant column.

3. A semiconductor device as defined in claim 2, including a redundancy programming circuit for said programming of said switches, said circuit programming circuit comprising:
    (a) a level shifter circuit with latching having first and second outputs for generating said first and second control signals thereat, said circuit having an input for receiving a RESET signal to drive and latch said first and second outputs at a boosted supply voltage level, each said output in a respective latch state being pulled down to a low level through an N-channel transistor as the other output is latched high through a P-channel pull-up transistor; the output being set and reset by pull-down transistors;
    (b) a fuse element interposed between on of said pull-down transistors and one of said outputs, a state of said fuse determining the relative output state of said outputs when said RESET signal is applied to said latching circuit.

4. A redundancy programming circuit for controlling redundancy passgate switches, said programming circuit comprising:
    (a) a level shifter circuit with latching having first and second outputs for generating said first and second control signals thereat, said circuit having an input for receiving a RESET signal to drive and latch said first and second outputs at a boosted supply voltage level, each said output in a respective latch state being pulled down to a low level through an N-channel transistor as the other output is latched high through a P-channel pull-up transistor; the output being set and reset by pull-down transistors;
    (b) a fuse element interposed between on of said pull-down transistors and one of said outputs, a state of said fuse determining the relative output state of said outputs when said RESET signal is applied to said latching circuit.

* * * * *